United States Patent [19]

Nishizawa et al.

[11] Patent Number: 5,500,079
[45] Date of Patent: Mar. 19, 1996

[54] DRY ETCHING METHOD

[75] Inventors: Jun-ichi Nishizawa, Sendai; Kenji Yamamoto, Chiba, both of Japan

[73] Assignee: Research Development Corporation of Japan, Japan

[21] Appl. No.: 237,417

[22] Filed: May 3, 1994

Related U.S. Application Data

[63] Continuation of Ser. No. 987,828, Dec. 9, 1992, abandoned.

[30] Foreign Application Priority Data

Dec. 10, 1991 [JP] Japan .................................... 3-349847

[51] Int. Cl.$^6$ .................................................. H01L 21/00
[52] U.S. Cl. .................................. 156/643.1; 156/647.1; 156/651.1; 156/662.1
[58] Field of Search ............................ 156/643.1, 646.1, 156/662.1, 647.1, 651.1

[56] References Cited

U.S. PATENT DOCUMENTS

| | | | |
|---|---|---|---|
| 4,643,799 | 2/1987 | Tsujii et al. | 156/643 X |
| 4,693,779 | 9/1987 | Okuhira et al. | 156/643 X |

OTHER PUBLICATIONS

Patent Abstracts of Japan, vol. 11, No. 17 (E–471), 17 Jan. 1987 & JP–A–61 189 644 (Hitachi Ltd.) 23 Aug. 1986.
Takashi Meguro et al., "Layer–by–layer controlled digital etching by means of an electron–beam–excited plasma system", Japanese Journal of Applied Physics, vol. 29, No. 10, Oct. 1990, Tokyo, Japan, pp. 2216–2219.
Y. Horiike et al., "Excimer–laser etching on Silicon", Applied Physics A. Solids and Surfaces, vol. A44, No. 4, Dec. 1987, Heidelberg DE, pp. 313–332.
Patent Abstracts of Japan, vol. 11, No. 15, No. 308 (E–1097) 7 Aug. 1991 & JP–A–31 10 844 (Rikagaku Kenkyusho) 10 May 1991.
T. Meguro et al., "Digital etching of GaAs: New approach of dry etching to atomic ordered processing", Applied Physics Letters, vol. 56, No. 16, 16 Apr. 1990, New York, US, pp. 1552–1554.
J. Gary Eden, "Photochemical processing of semiconductors: New applications for visible and ultraviolet lasers", IEEE Circuits and Devices Magazine, vol. 2, No. 1, Jan. 1986, New York US, pp. 18–24.
P. D. Brewer et al., "Laser–assisted dry etching", Solid State Technology, vol. 28, No. 4, Apr. 1985, Washington, US, pp. 273–278.
P. D. Brewer et al., "Dry, laser–assisted rapid HBr etching of GaAs", Applied Physics Letters, vol., 47, No. 3, Aug. 1985, New York, US, pp. 310–312.

*Primary Examiner*—Thi Dang
*Attorney, Agent, or Firm*—Fish & Richardson

[57] ABSTRACT

A semiconductor material to be etched is held in a reaction chamber at a predetermined temperature. A reactive etching gas such as a chlorine gas is introduced into the reaction chamber for a first period of time. Thereafter, the reaction chamber is evacuated for a second period of time, and ultraviolet radiation is applied to the semiconductor material for a third period of time within the second period of time for thereby etching the semiconductor material to a depth on the order of a molecular or atomic layer.

5 Claims, 6 Drawing Sheets

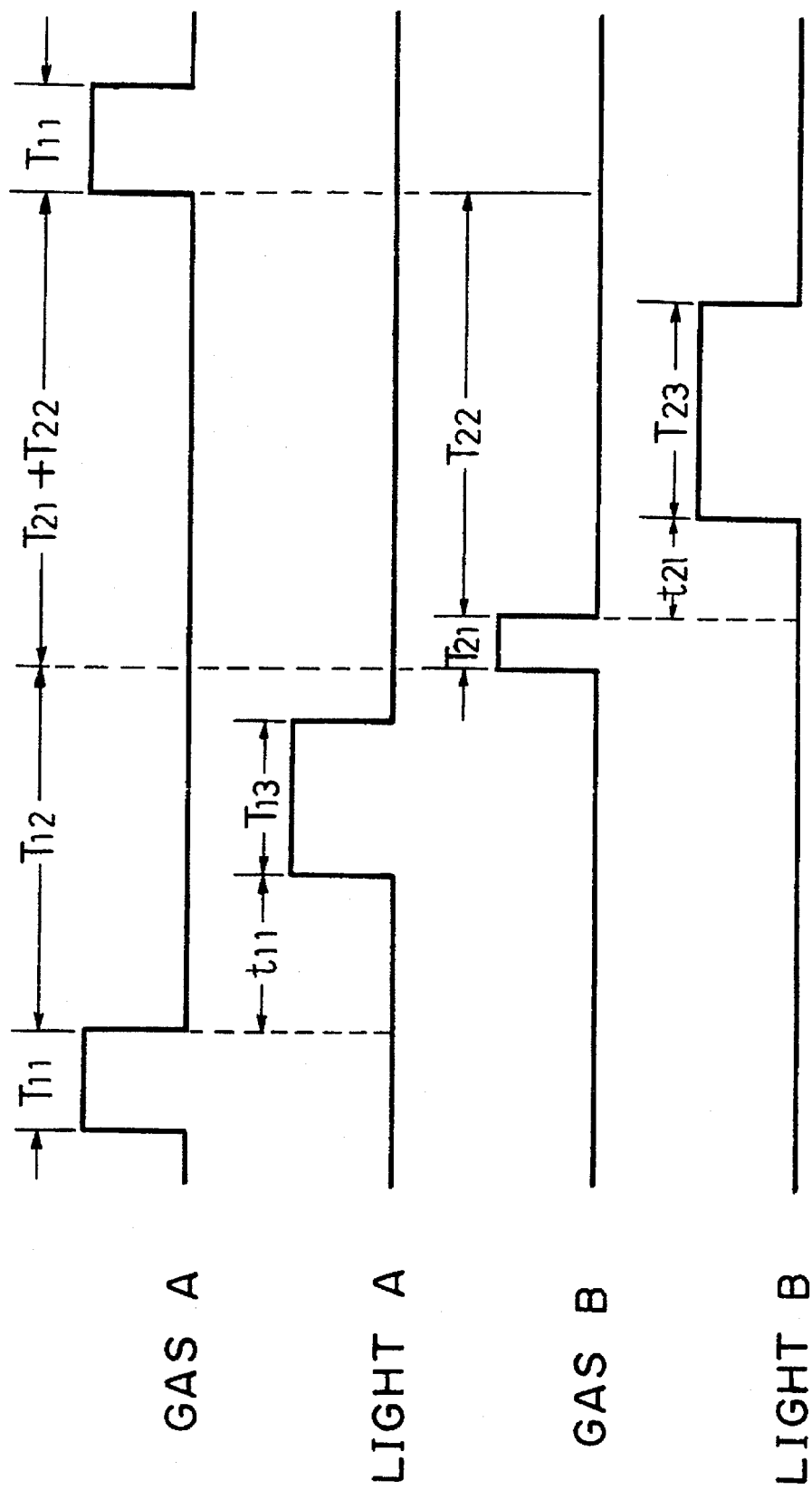

DRY ETCHING METHOD

This application is a continuation of Ser. No. 07/987,828, filed Dec. 9, 1992, now abandoned.

BACKGROUND OF THE INVENTION

1. Field of the Invention

The present invention relates to a dry etching method, and more particularly to a method of selectively etching a semiconductor material through a photochemical reaction.

2. Description of the Prior Art

Heretofore, the reactive ion etching process has widely been used as a dry etching process for etching substrates in the fabrication of LSI circuits or the like. As the size of circuit functions per chip is reduced, the reactive ion etching process tends to cause more damage to substrates due to plasma reaction. Another problem of the reactive ion etching process is that since the configuration of the etched groove does not exhibit crystal anisotropy, the etched grooves cannot be used for anisotropic epitaxy.

Japanese laid-open patent publication No. 60-165725 (Japanese patent application No. 59-20995) discloses a photoetching process which applies a laser beam or ultraviolet radiation. According to the disclosed photoetching process which is one form of dry etching process, no damage is caused to substrates by plasma reaction and the etched surfaces of the grooves are available for anisotropic epitaxy.

According to the photoetching process, a material to be etched is housed in a vacuum chamber, and while an etching gas such as a reactive gas or the like is being introduced into the vacuum chamber, light that dissociates the etching gas is selectively applied to the region of the material which is to be etched. The depth to which the material is to be etched is basically determined by adjusting the amount of the etching gas to be introduced, the time during which the etching gas is to be introduced, and the time during which energy particles, i.e., light, are applied to the crystal surface of the material that is exposed to the etching gas, thereby controlling the time of a photochemical reaction.

As more and more circuit elements per chip are required in LSI circuits, pattern dimensions need to be smaller, and the etching depth also needs to be controlled with greater accuracy. For example, the fabrication of static induction field-effect transistors (SIT) of GaAs requires the etching depth to be controlled with an accuracy on the order of at least 10 Å in order to etch an epitaxial layer that has been grown in terms of molecular layers.

However, such a high accuracy for the control of the etching depth cannot be achieved through the adjustment of the photochemical reaction time in the above photoetching process. In the actual fabrication of semiconductor devices, it has been necessary to control the etching depth as it is measured with an expensive etching monitor during the etching process, or to measure the etching depth with the etching monitor after the etching process and to additionally effect the etching process if the etching depth is not sufficient. Consequently, the conventional process of controlling the etching depth has been highly difficult to carry out and the reproducibility of the controlling process has been poor.

SUMMARY OF THE INVENTION

It is therefore an object of the present invention to provide a dry etching method which prevents a material to be etched from being damaged since the etching reaction which can control the etching depth highly accurately is caused by the application of light.

According to the present invention, there is provided a method of etching a semiconductor material, comprising holding the semiconductor material to be etched in a reaction chamber at a predetermined temperature, introducing a reactive etching gas into the reaction chamber for a first period of time, thereafter evacuating the reaction chamber for a second period of time, applying light to the semiconductor material for a third period of time within the second period of time for etching the semiconductor material to a depth on the order of a molecular or atomic layer.

The method may further comprise the step of discharging the etching gas from the reaction chamber while the etching gas is being introduced into the reaction chamber for the first period of time.

The method may also include the step of repeating the step of introducing a reactive etching gas, the step of evacuating the reaction chamber, and the step of applying light to control the depth.

The semiconductor material may comprise a monocrystalline material, and the etching gas may be of crystal surface selectivity, the light having a wavelength selected to selectively etch the monocrystalline material into a configuration with crystal anisotropy.

The third period of time for which the light is applied is selected for the etching gas that has been adsorbed by the semiconductor material to contribute fully to the etching of the semiconductor material.

With the method according to the present invention, the semiconductor material is kept at the predetermined temperature, and the etching gas is introduced under a suitable pressure into the reaction chamber for the first period of time while the etching gas may be discharged at the same time. A certain amount of the introduced etching gas is adsorbed on the semiconductor material. Then, the introduced etching gas is discharged for the second period of time, and while the etching gas is being discharged, the light is applied to the semiconductor material for the third period of time to cause the semiconductor material to photochemically react with the adsorbed etching gas. A reaction product generated in the photochemical reaction leaves the surface of the semiconductor material, thereby etching the semiconductor material. In the above cycle, the semiconductor material is etched in a self-limited manner to an etching depth on the order of a molecular or atomic layer. As a result, the etching depth can be controlled in terms of a molecular or atomic layer without the use of any special expensive etching depth monitor, and can be determined by the number of times that the above cycle is repeated.

Since the light is employed to give rise to the photochemical reaction, the etched material is free from damage which would otherwise be induced by a plasma, and the etching depth can be controlled highly accurately in terms of a molecular or atomic layer.

If the semiconductor material comprises a monocrystalline material, and the etching gas has crystal surface selectivity, the light may have a wavelength selected to selectively etch the monocrystalline material into a configuration with crystal anisotropy.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 6 is a timing chart of a etching sequence for alternately etching surfaces A, B of a compound semiconductor with two gases that are alternately introduced.

DETAILED DESCRIPTION OF THE PREFERRED EMBODIMENT

Figure 1:
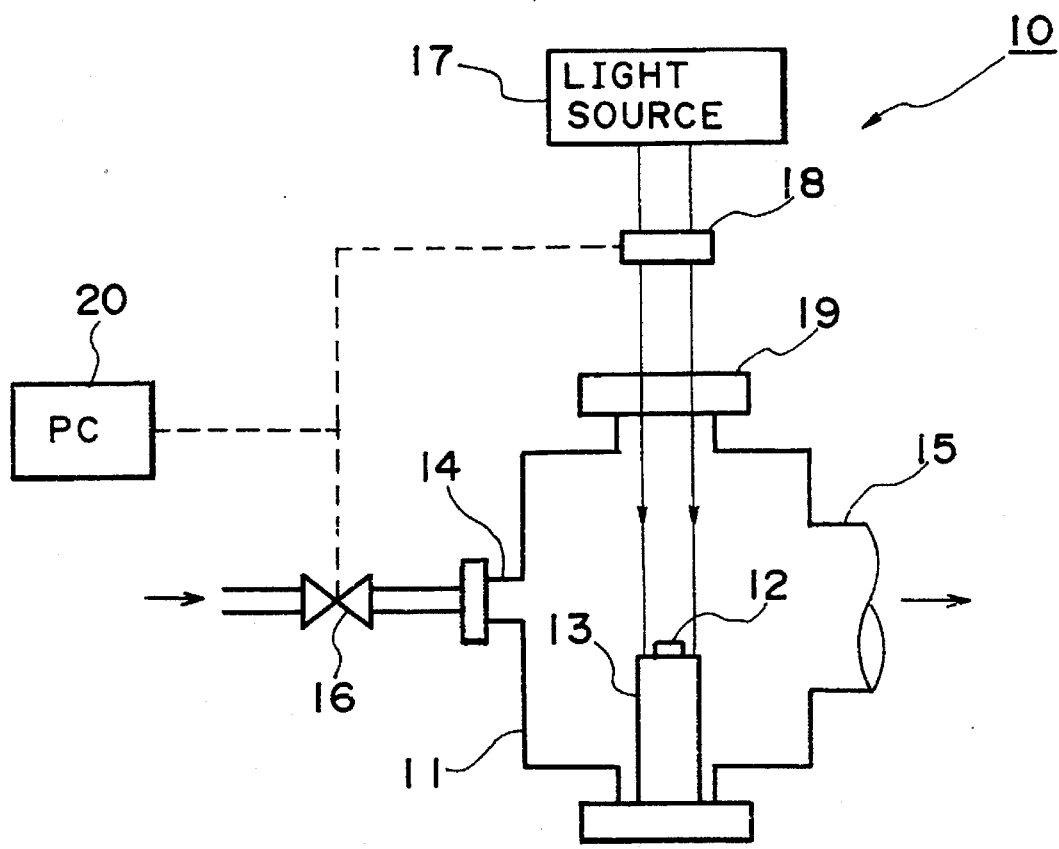
FIG. 1 is a schematic diagram of a dry etching apparatus for carrying out a dry etching method according to the present invention.

As shown in FIG. 1, a dry etching apparatus 10 for carrying out a dry etching method according to the present invention comprises a vacuum chamber (reaction chamber) 11 which serves an etching chamber. The vacuum chamber 11 houses therein a susceptor 13 for supporting a material 12 such as a crystalline substrate or the like which is to be etched. The vacuum chamber 11 has a gas inlet port 14 for introducing an etching gas into the etching chamber and a gas outlet port 15 for evacuating the vacuum chamber 11. A source (not shown) of an etching gas is connected to the gas inlet port 14 through a pneumatic pressure-actuated valve 16.

A light source 17 is disposed above the vacuum chamber 11 for emitting light to accelerate a chemical reaction between the etching gas adsorbed on the material 12 and surface molecules of the material 12. Light, such as ultraviolet radiation, emitted from the light source 17 passes through a motor-driven shutter 18 above the vacuum chamber 11 and a window 19 on the vacuum chamber 11, and is applied to the material 12 on the susceptor 13 in the vacuum chamber 11. Upon exposure to the applied ultraviolet radiation, the etching gas adsorbed on the material 12 and surface molecules of the material 12 chemically react with each other, generating a volatile reaction product.

The pneumatic pressure-actuated valve 16 and the motor-driven shutter 18 are controlled by a programmable controller 20.

For dry-etching the material 12, the material 12 is placed on the upper surface of the susceptor 13 in the vacuum chamber 11, and kept at a predetermined temperature. Then, the vacuum chamber 11 is evacuated through the gas outlet port 15.

At a first stage, while the vacuum chamber 11 is being evacuated through the gas outlet port 15, the pneumatic pressure-actuated valve 16 is opened by the programmable controller 20 to introduce an etching gas from the gas inlet port 14 into the vacuum chamber 11 under a predetermined pressure for a predetermined period of time. The introduced etching gas is adsorbed on the material 12. After the etching gas has been adsorbed by the material 12, the pneumatic pressure-actuated valve 16 is closed, thereby stopping the introduction of the etching gas.

At a second stage, the etching gas remaining in the vacuum chamber 11 is discharged from the gas outlet port 15 for a predetermined period of time. Therefore, only the etching gas that has been adsorbed by the material 12 is left in the vacuum chamber 11.

During the predetermined period of time in which the etching gas is discharged from the gas outlet port 15, light having a suitable wavelength for dissociating the etching gas is emitted from the light source 17, and the motor-driven shutter 18 is controlled by the programmable controller 20 to apply the light to the surface of the material 12 for a certain period of time. Upon exposure to the applied light, the etching gas adsorbed by the material 12 and surface molecules of the material 12 are caused to photochemically react with each other, generating a volatile reaction product. The volatile reaction product is volatilized from the surface of the material 12 and discharged from the gas outlet port 15.

In one cycle of dry etching process, which is composed of the first and second stages described above, only the amount of etching gas adsorbed on the material 12 contributes to the etching of the material 12. With the emitted light being applied to the material 12 for a sufficient period of time, the adsorbed etching gas is fully consumed to etch the material 12. The material 12 can be etched to a depth corresponding to a molecular or atomic layer in one dry etching cycle.

Accordingly, the etching depth can be controlled in terms of a molecular or atomic layer and hence can be controlled highly accurately. Since the etching gas is uniformly adsorbed by the etching material 12 and only the adsorbed etching gas contributes to the etching of the material 12, the material 12 is prevented from being etched to irregular etching depths which would otherwise occur under the influence of a flow of etching gas. The material 12 is therefore etched to a uniform etching depth.

The above dry etching cycle of first and second stages is repeated to control the etching depth in terms of a molecular or atomic layer. Consequently, the etching depth can be controlled highly accurately with high reproducibility without the use of any expensive etching depth monitor.

The gas outlet port 15 may be closed when the etching gas is introduced from the gas inlet port 14 into the vacuum chamber 11, and may be opened to discharge the etching gas after a certain amount of etching gas is adsorbed on the material 12.

A specific example in which a material 12 in the form of a substrate having a surface n-type GaAs (100) or (111)B is etched will be described below. In this example, a chlorine gas $Cl_2$ with crystal surface selectivity is used as the etching gas, and an Xe/Hg lamp is used as the light source 17. The material 12 is placed on the susceptor 13 in the vacuum chamber 11, and kept at a predetermined temperature. Then, the vacuum chamber 11 is evacuated through the gas outlet port 15.

When the etching gas is introduced into the vacuum chamber 11, if the temperature of the GaAs substrate were too high or the pressure of the introduced etching gas were too high, the GaAs substrate would start to be etched only by the introduction of the etching gas. For example, when the chlorine gas $Cl_2$ is introduced into the vacuum chamber 11 under a pressure of $1\times10^{-4}$ Torr, the material 12 in the form of a n-type GaAs substrate does not start being etched only by the introduction of the etching gas if the temperature of the GaAs substrate is 60° C. or lower. However, when the chlorine gas $Cl_2$ is introduced into the vacuum chamber 11 under a pressure of $1 \times 10^{-3}$ Torr, the material 12 in the form of a GaAs (111)B substrate is etched at a rate of 10 Å/min. even if the temperature of the n-type GaAs substrate is 3° C. The temperature of the GaAs substrate is increased by exposure to light emitted from the Xe/Hg lamp. For example, when the GaAs substrate is exposed to light whose intensity is 0.19 W/cm$^2$, the temperature thereof rises to about 30° C. If the GaAs substrate is kept at 10° C. before it is exposed to the light, then the temperature thereof increases up to 40° C. when exposed to the light. Therefore, the light source 17 should be selected such that the intensity of emitted light is sufficiently low.

For example, the chlorine gas $Cl_2$ may be introduced into the vacuum chamber 11 under a pressure of $1 \times 10^{-4}$ Torr, the GaAs substrate may be kept at a temperature of 10° C., and etched with light from the Xe/Hg lamp whose intensity is 0.19 W/cm$^2$.

Figure 2:
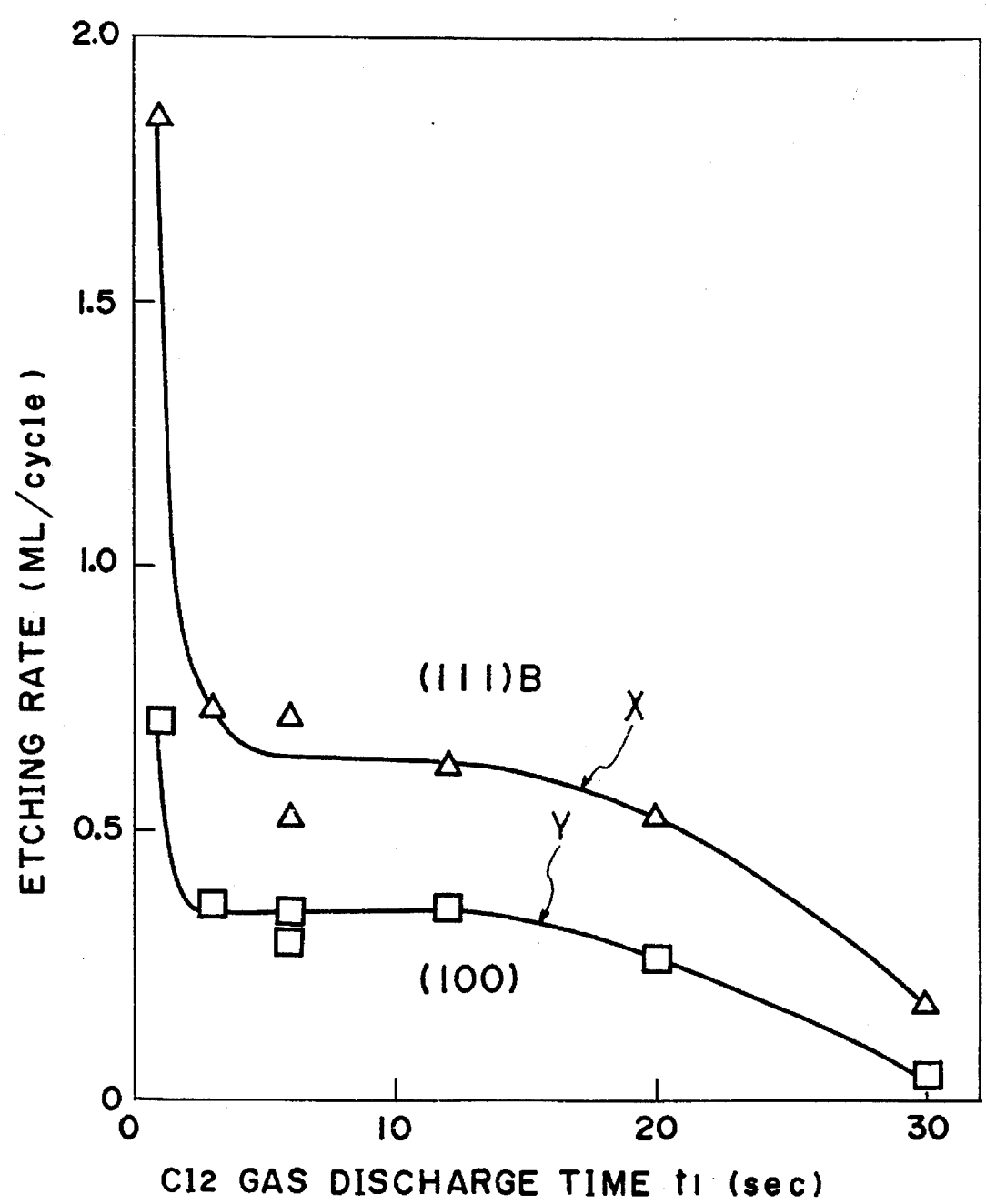
FIG. 2 is a graph showing the relationship between the etching rate of a GaAs substrate and the chloride gas discharge time in a second stage during operation of the dry etching apparatus shown in FIG. 1.
Figure 3:
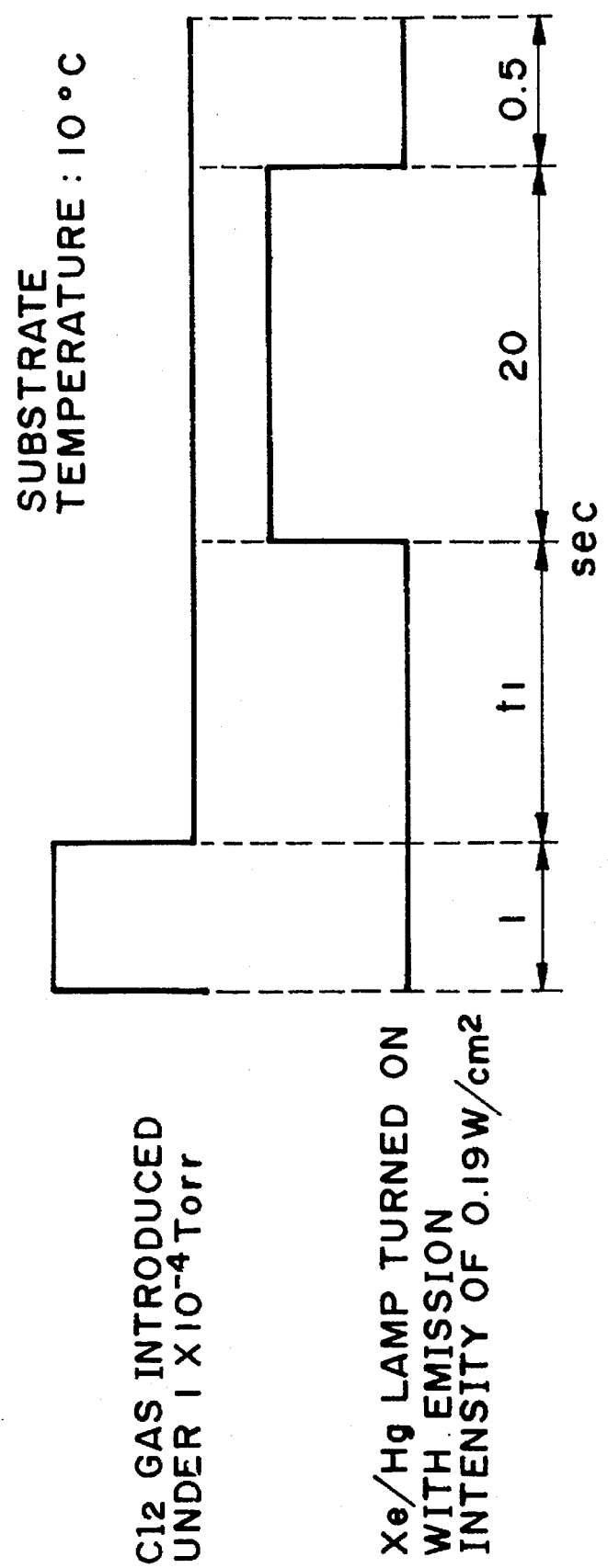
FIG. 3 is a timing chart showing the timing of the introduction of a chloride gas and the application of ultraviolet radiation for the measurement of the relationship shown in FIG. 2.

FIGS. 2 and 3 show one etching process by way of example. The vacuum chamber 11 was evacuated through the gas outlet port 15, and the chlorine gas $Cl_2$ was introduced into the vacuum chamber 11 for 1 second. As shown in FIGS. 2 and 3, the chlorine gas $Cl_2$ remaining in the vacuum chamber 11 was discharged for $t_1$ seconds, which may range from 1.5 to 30 seconds, after the introduction of the chlorine gas $Cl_2$. Thereafter, while vacuum chamber 11 was being evacuated through the gas outlet port 15, the GaAs substrate was exposed to ultraviolet radiation from the Xe/Hg lamp for 20 seconds. After the motor-driven shutter 18 was closed, the vacuum chamber 11 was evacuated through the gas outlet port 15 for 0.5 second. The above cycle was repeated 1000 times to etch the GaAs substrate. The relationship between the etching rate of the GaAs substrate per cycle and the time in which the chlorine gas $Cl_2$ was discharged from the end of the introduction of the chlorine gas $Cl_2$ to the application of the ultraviolet radiation, is shown in FIG. 2.

In FIG. 2, a characteristic curve X represents the etching rate of the substrate surface n-type GaAs (111)B, and a characteristic curve Y represents the etching rate of the substrate surface n-type GaAs (100). The etching rate is expressed in terms of molecular layers. One ML equals 3.26 Å for the substrate surface n-type GaAs (111)B, and 2.83 Å for the substrate surface n-type GaAs (100).

FIG. 2 indicates that irrespective of whether the GaAs substrate has the substrate surface n-type GaAs (111)B or n-type GaAs (100), the etching rate is saturated in a chlorine gas discharge time period from 3 to 12 seconds. Therefore, in order to remove the remaining chlorine gas from the vacuum chamber 11, the vacuum chamber 11 may be evacuated for the time from 3 to 12 seconds. The etching rate is higher when the chlorine gas discharge time is shorter than 3 seconds because the chlorine gas remaining in the vacuum chamber 11 is not adsorbed on the GaAs substrate, but is dissociated by the applied ultraviolet radiation and contributes to the etching process. The etching rate is lower when the chlorine gas discharge time is longer than 12 seconds because the chlorine gas adsorbed on the GaAs substrate leaves the GaAs substrate before the ultraviolet radiation is applied thereto.

Figure 4:
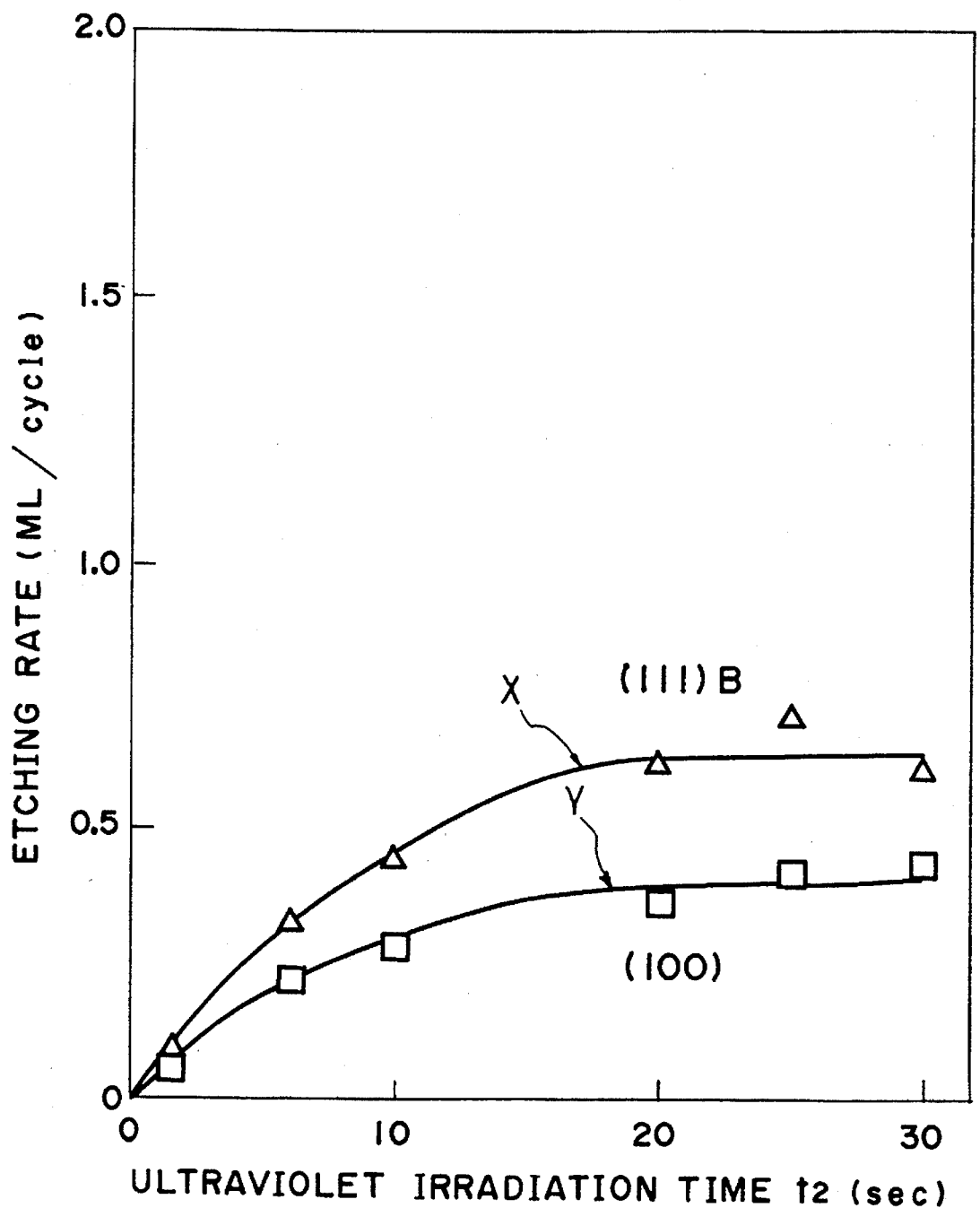
FIG. 4 is a graph showing the relationship between the etching rate of a GaAs substrate and the application of ultraviolet radiation in a second stage during operation of the dry etching apparatus shown in FIG. 1.
Figure 5:
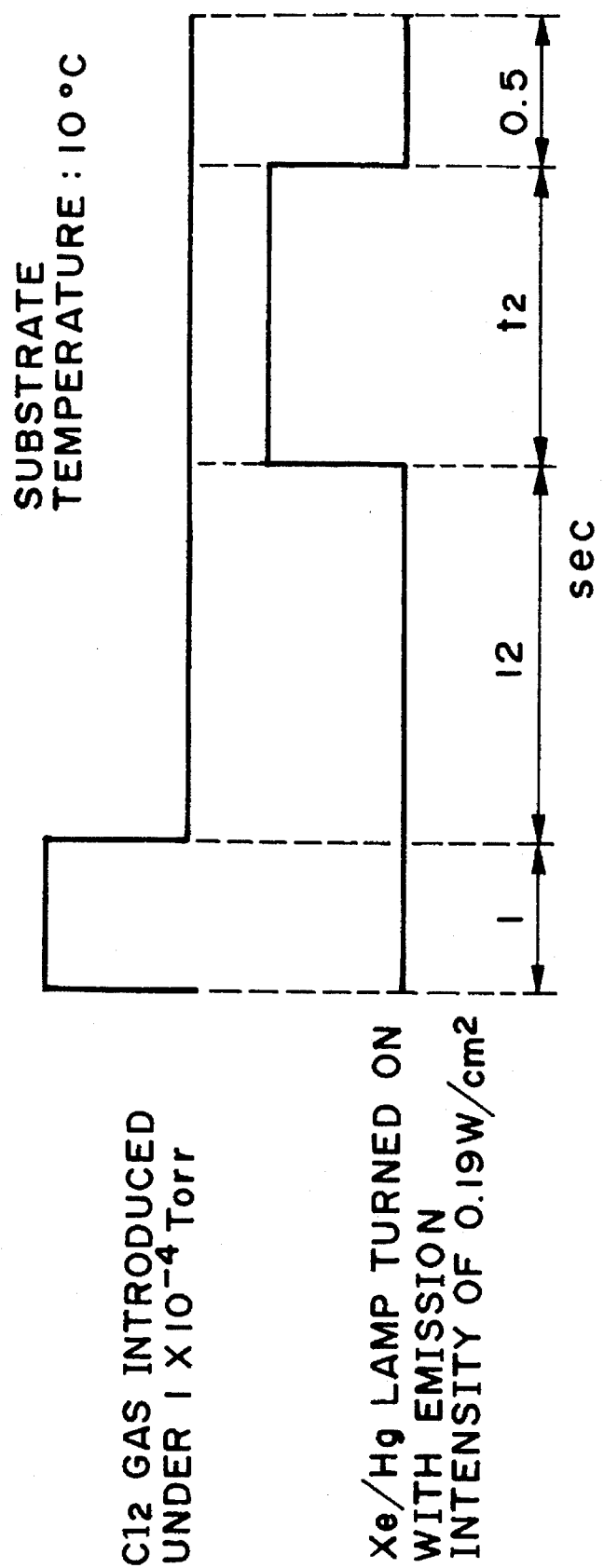
FIG. 5 is a timing chart showing the timing of the introduction of a chloride gas and the application of ultraviolet radiation for the measurement of the relationship shown in FIG. 4.

FIGS. 4 and 5 show another etching process by way of example. In the first stage, the vacuum chamber 11 was evacuated through the gas outlet port 15, and the chlorine gas $Cl_2$ was introduced into the vacuum chamber 11 for 1 second. As shown in FIGS. 4 and 5, in the second stage, the chlorine gas $Cl_2$ remaining in the vacuum chamber 11 was discharged for 12 seconds after the introduction of the chlorine gas $Cl_2$. Thereafter, while vacuum chamber 11 was being evacuated through the gas outlet port 15, the GaAs substrate was exposed to ultraviolet radiation from the Xe/Hg lamp for $t_2$ seconds, which may range from 1 to 30 seconds. After the motor-driven shutter 18 was closed, the vacuum chamber 11 was evacuated through the gas outlet port 15 for 0.5 second. The relationship between the etching rate of the GaAs substrate per cycle and the time $t_2$ is shown in FIG. 4.

In FIG. 4, a characteristic curve X represents the etching rate of the substrate surface n-type GaAs (111)B, and a characteristic curve Y represents the etching rate of the substrate surface n-type GaAs (100).

FIG. 4 indicates that irrespective of whether the GaAs substrate has the substrate surface n-type GaAs (111)B or n-type GaAs (100), the etching rate is saturated when the time $t_2$ exceeds 20 seconds. The saturated etching rate corresponds to an about ⅔ molecular layer for the substrate surface n-type GaAs (111)B, and an about ⅓ molecular layer for the substrate surface n-type GaAs (100). Therefore, the application of the ultraviolet radiation for 20 seconds in the second stage is sufficient to cause the chlorine gas adsorbed by the GaAs substrate and the atoms on the surface of the GaAs substrate to chemically react with each other and also to cause the reaction production to leave the surface of the GaAs substrate.

The above results clearly show the advantage of the present invention that the etching depth can be controlled highly accurately in terms of molecular or atomic layers based on only the number of times that the cycle composed of first and second stages is repeated under suitable etching conditions. In the above examples, the etched surface of the substrate is given an excellent mirror finish. With the crystal surface selectivity of the chlorine gas $Cl_2$, the substrate surfaces GaAs (100) and GaAs (111)B are etched, but the substrate surface GaAs (111)A is not etched at all. It was confirmed through an electron microscope observation that the etched configurations of the GaAs substrate surfaces (111)B, (100) exhibit crystal anisotropy.

The etching gas may be a halide gas such as $CH_3Br$. In the case where $CH_3Br$ is used as the etching gas, it is not necessary to cool the GaAs substrate to about 10° C., and an excimer laser may be used as an effective light source for $CH_3Br$ reaction. The material that can be etched according to the method of the present invention is not limited to a GaAs substrate, but may be an Si substrate. Any combination of materials to be etched and etching gases may be employed insofar as the etching gas do not photochemically react with the material when no light is applied and the etching gas photochemically react with the material to generate a volatile reaction product when light is applied. The light source may be of any type insofar as the wavelength of its radiation is effective to dissociate the etching gas or accelerate the surface reaction between the etching gas and the substrate. The light source may be a laser for emitting coherent radiation or a lamp such as an Xe/Hg lamp for emitting incoherent radiation.

Particularly, compound semiconductors such as of GaAs can be etched highly accurately by alternately introducing two gases, i.e., an etching gas for etching a substrate surface A and an etching gas for etching a substrate surface B, and alternately applying two types of light to the substrate. For example, as shown in FIG. 6, an etching gas A for etching a substrate surface A is introduced for $T_{11}$ seconds and discharged for $T_{12}$ seconds, and a light A is applied to etch the substrate surface A. Then, an etching gas B for etching a substrate surface B is introduced for $T_{21}$ seconds and discharged for $T_{22}$ seconds, and a light B is applied to etch the substrate surface B. Such a cycle is repeated to etch the substrate in terms of molecular layers.

With the dry etching method according to the present invention, the etching depth can be controlled highly accurately in a self-limited manner in terms of a molecular or atomic layer, such as ⅓ or ⅔ molecular layer per etching cycle, without the use of any expensive etching depth monitor. The etched substrate surface is free of radiation-induced damage, and uniformly etched with a mirror finish. Since the configuration of the etched grooves exhibits crystal anisotropy, the etched crystalline surface orientation can be employed for crystal anisotropy epitaxy. The dry etching method according to the present invention can therefore be highly advantageous if used in the fabrication of semiconductor devices with very small dimensions for ultrahigh-speed devices, quantum-effect devices, or the like, since a maskless process utilizing the crystal anisotropy can be employed.

Although a certain preferred embodiment of the present invention has been shown and described in detail, it should be understood that various changes and modifications may be made therein without departing from the scope of the appended claims.

What is claimed is:

1. A method of etching a GaAs monocrystalline material in a reaction chamber, said method comprising:

introducing a first of two different kinds of reactive etching gases to a concentration into the reaction chamber for a first period of time, said reactive etching gases being of the types which have a crystal plane preference between at least one first coexisting different crystal plane and a second coexisting different crystal plane;

maintaining the monocrystalline material to be etched in a reaction chamber at a temperature at which no spontaneous etching occurs in said concentration of etching gas;

after said maintaining, evacuating said reaction chamber to remove reactive etching gas not adsorbed to said monocrystalline material for a second period of time sufficient to allow said reactive etching gas to be adsorbed on a surface of the crystal;

applying one of two different bands of light of appropriately selected wavelengths and intensities so that no temperature of said monocrystalline material increases beyond a level to said monocrystalline material for a third period of time to preferentially etch one of said crystal planes, said one crystal plane having surfaces A and B, of said monocrystalline material to a crystallographic orientation having a depth on the order of one of a molecular or atomic layer to form a side wall of crystal anisotropy having an intended crystal surface orientation, and wherein a first of said two different kinds of gases introduced in said introducing step etches said surface A of said GaAs substrate, a second of said two different kinds of gases etching said surface B;

repeating the above steps with a second of said two different kinds of reactive etching gases and applying the other of two different bands of light.

2. A method of etching as in claim 1 wherein said second period of time is between 3 and 12 seconds.

3. A method as in claim 1 wherein said third period of time is between and 1 and 20 seconds.

4. A method as in claim 1 wherein a {111} side wall is selectively etched.

5. A method as in claim 1 wherein said applying uses an intensity such that no surface of said monocrystalline material increases to a temperature at which spontaneous etching could occur at any concentration of etching gas.

* * * * *